United States Patent
Elahipanah et al.

(10) Patent No.: US 11,869,940 B2
(45) Date of Patent: *Jan. 9, 2024

(54) FEEDER DESIGN WITH HIGH CURRENT CAPABILITY

(71) Applicant: II-VI Delaware, Inc., Wilmington, DE (US)

(72) Inventors: Hossein Elahipanah, Sollentuna (SE); Nicolas Thierry-Jebali, Stockholm (SE); Adolf Schoner, Hasselby (SE); Sergey Reshanov, Upplands-Vasby (SE)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/150,611

(22) Filed: Jan. 5, 2023

(65) Prior Publication Data

US 2023/0147611 A1    May 11, 2023

Related U.S. Application Data

(63) Continuation of application No. 17/448,790, filed on Sep. 24, 2021, now Pat. No. 11,575,007, which is a
(Continued)

(30) Foreign Application Priority Data

Sep. 15, 2017  (SE) .................................... 1751140-3

(51) Int. Cl.
*H01L 29/06* (2006.01)
*H01L 29/16* (2006.01)
(Continued)

(52) U.S. Cl.
CPC ...... *H01L 29/0692* (2013.01); *H01L 29/1608* (2013.01); *H01L 29/6606* (2013.01); *H01L 29/868* (2013.01)

(58) Field of Classification Search
CPC ............. H01L 29/0692; H01L 29/1608; H01L 29/6606; H01L 29/868
(Continued)

(56) References Cited

U.S. PATENT DOCUMENTS 2,705,406 A   4/1955   Morrison
5,693,569 A   12/1997  Ueno
(Continued)

FOREIGN PATENT DOCUMENTS

EP    2058854 A2    5/2009
EP    2075847 A1    7/2009
(Continued)

OTHER PUBLICATIONS

International Preliminary Report on Patentability for corresponding International Application No. PCT/EP2018/074911 dated Dec. 4, 2019**.
(Continued)

*Primary Examiner* — Igwe U Anya
(74) *Attorney, Agent, or Firm* — Blank Rome LLP

(57) ABSTRACT

A feeder design is manufactured as a structure in a SiC semiconductor material comprising at least two p-type grids in an n-type SiC material (3), comprising at least one epitaxially grown p-type region, wherein an Ohmic contact is applied on the at least one epitaxially grown p-type region, wherein an epitaxially grown n-type layer is applied on at least a part of the at least two p-type grids and the n-type SiC material (3) wherein the at least two p-type grids (4, 5) are applied in at least a first and a second regions at least close to the at least first and second corners respectively and that
(Continued)

there is a region in the n-type SiC material (3) between the first and a second regions without any grids.

21 Claims, 16 Drawing Sheets

Related U.S. Application Data continuation of application No. 16/647,202, filed as application No. PCT/EP2018/074911 on Sep. 14, 2018, now Pat. No. 11,158,706.

(51) Int. Cl.
*H01L 29/66* (2006.01)
*H01L 29/868* (2006.01)

(58) Field of Classification Search
USPC .......................................................... 257/77
See application file for complete search history.

(56) References Cited

U.S. PATENT DOCUMENTS

| | | | |
|---|---|---|---|
| 6,049,108 A | 4/2000 | Williams et al. | |
| 6,091,108 A | 7/2000 | Harris et al. | |
| 6,104,043 A | 8/2000 | Hermansson et al. | |
| 6,462,393 B2 | 10/2002 | Buchanan et al. | |
| 6,673,662 B2 | 1/2004 | Singh | |
| 6,897,133 B2 | 5/2005 | Collard | |
| 6,936,850 B2 | 8/2005 | Friedrichs et al. | |
| 6,979,863 B2 | 12/2005 | Ryu | |
| 7,851,881 B1 | 12/2010 | Zhao et al. | |
| 8,633,560 B2 | 1/2014 | Aketa | |
| 8,704,295 B1 | 4/2014 | Darwish et al. | |
| 8,896,084 B2 | 11/2014 | Sugawara | |
| 9,577,046 B1 | 2/2017 | Hori et al. | |
| 11,158,706 B2* | 10/2021 | Elahipanah | H01L 29/1608 |
| 11,575,007 B2* | 2/2023 | Elahipanah | H01L 29/868 |
| 2003/0201464 A1 | 10/2003 | Hokomoto | |
| 2006/0255423 A1 | 11/2006 | Ryu et al. | |
| 2007/0001194 A1 | 1/2007 | Ono et al. | |
| 2007/0029573 A1 | 2/2007 | Cheng et al. | |
| 2007/0170436 A1 | 7/2007 | Sugawara | |
| 2007/0228505 A1 | 10/2007 | Mazzola et al. | |
| 2011/0021533 A1 | 1/2011 | Cook et al. | |
| 2013/0270577 A1 | 10/2013 | Svederg et al. | |
| 2014/0138705 A1 | 5/2014 | Zhang et al. | |
| 2014/0169045 A1 | 6/2014 | Ueno | |
| 2014/0264564 A1 | 9/2014 | Cheng et al. | |
| 2014/0367771 A1 | 12/2014 | Chatty et al. | |
| 2016/0093748 A1 | 3/2016 | Mieczkowski et al. | |
| 2016/0126347 A1 | 5/2016 | Wada et al. | |
| 2016/0233210 A1 | 8/2016 | Matocha et al. | |

FOREIGN PATENT DOCUMENTS

| | | |
|---|---|---|
| JP | H09191109 A | 7/1997 |
| WO | 9832177 A1 | 7/1998 |
| WO | 9926296 A2 | 5/1999 |
| WO | 2015104084 A1 | 7/2015 |
| WO | 2019053204 A1 | 3/2019 |

OTHER PUBLICATIONS

International Search Report and Written Opinion for corresponding International Application No. PCT/EP2018/074911 dated Dec. 5, 2018**.

Bakowski, Prospects and Development of Vertical Normally-off JFETs in SiC, Journal of Telecommunications and Information Technology, Apr. 2009, pp. 25-36**.

Schoner, et al., (Invited) Progress in Buried Grid Technology for Improvements in on-Resistance of High Voltage SiC Devices, ECS Transactions.vol. 75, No. 12, Sep. 23, 2016 (Sep. 23, 2016), pp. 183-190**.

Sung, et al., Monolithically Integrated 4H-SiC MOSFET and JBS Diode (JBSFET) Using a Single Ohmic/Schottky Process Scheme in IEEE Electron Device Letter, vol. 37, Issue 12, Dec. 2016, pp. 1605-1608**.

Sung, et al., On Developing One-Chip Integration of 1.2 kV SiC MOSFET and JBS Diode (JBSFET) in IEEE Transactions on Industrial Electronics, vol. 64, Issue: 10, Oct. 2017**.

* cited by examiner

P-type grid (5) protecting the sharp corners of the epitaxial p-type region (7)

FEEDER DESIGN WITH HIGH CURRENT CAPABILITY

CROSS-REFERENCE TO RELATED APPLICATIONS

This is a continuation of U.S. patent application Ser. No. 17/448,790, filed Sep. 24, 2021, which is a continuation of U.S. patent application Ser. No. 16/647,202, filed Mar. 13, 2020, issued as U.S. Pat. No. 11,158,706. U.S. patent application Ser. No. 16/647,202 is a national stage of PCT/EP2018/074911, filed Sep. 14, 2018, which claims priority to Swedish Patent Application No. 1751140-3, filed Sep. 15, 2017, each is incorporated by reference in their entirety.

TECHNICAL FIELD

The present invention relates to a structure in SiC which integrates an epitaxial PiN diode with the feeder of a buried grid (BG) power device and which uses the BG to protect the sharp corners of the PiN diode from high electric field at voltage blocking.

BACKGROUND

Current Schottky diodes like JBS- or MPS-diodes, as well as MOSFETs use integrated PiN diodes or pn-body diodes to handle large surge currents. The problems according to the state of the art include:
  Relative high forward voltage drop at elevated currents of the PiN diode due to limited injection efficiency and high ohmic contact resistance.
  The switch from Schottky to PiN diode characteristic at high forward voltage causing a snapback effect due to the voltage drop at the PN junction in Schottky mode.
  Bipolar degradation caused by ion implantation which deteriorate the device performance and lifetime.

An embedded doping structure or buried grid (BG) can be used to shield the Schottky contact or MOSFET from high electric field at the surface of a SiC power semiconductor. Therefore, it is desirable to alleviate the electric field at the surface of the semiconductor or the interface to other electric field sensitive materials like the gate oxide.

While in JBS rectifiers the P+ grids are mainly used to shield the Schottky contact in reverse mode, in MPS rectifiers the embedded P+ grids have an additional function and the corresponding P+ N junctions become conductive in on-state. The forward biased P+ N junctions produce the injection of holes into the drift causing conductivity modulation like in PiN rectifiers. This turning behavior of MPS diodes from Schottky-like to PiN-like is desirable for power applications. It requires the formation of Ohmic contacts to the P+ regions. The P-well doping of a MOSFET has similar functionality and is called "body diode".

Forming the P+ grids by ion implantation is a common method in most devices since ion implantation is a standard industrialized process. The advantage is to form a natural rounding of the grid due to the straggling of the implanted ions that reduces the electric field crowding. To have a high injection efficiency, one has to increase the thickness and doping of the P+ region. Forming a thick enough highly-doped P+ region may need high energy and high dose ion implantation. High dose ion implantation causes crystalline damage, which cause the so-called bipolar degradation and significantly degrades the injection efficiency of the P+ regions. Moreover, there has been challenges to form low-resistive and uniform Ohmic contacts to implanted P regions. Hence, the switching of the on-state characteristic from Schottky or MOSFET behavior to PiN behavior occurs at much higher voltages and causes a high snapback voltage, which is not desirable for power applications. Most of commercially available SiC devices suffer from this late injection behavior.

The P+ regions can be formed either by ion implantation or epitaxial growth processes. The advantages and drawbacks of both processes are as follows:
Ion Implanted P Region Advantages:
  Selectively doped areas by masking, oxide or photoresist mask depending on process temperature and/or implant dose.
  Good controllability of the doping, as well as homogeneity over the wafer.
  Well know doping technique.
Disadvantages:
  Low efficiency of implanted emitters due to recombination at defect centers remaining from implantation damage→limited surge current capability of MPS rectifiers
  Limitation in doping level due to increasing implantation damage with increasing implant dose.
  No diffusion of commonly used acceptor and donor dopants in SiC→implanted pn-junctions are located where the implant profile ends and where implant damage is high.
  Limitation in thickness due to limitations in implantation energy, 1 µm thickness requires 400-1000 keV implantation energy depending on the implanted ions.
  High energy implantation is a high cost process.
Epitaxial P Region Advantages:
  High injection efficiency due to superior high-doped material quality
  Control of the grid thickness and doping profile
  Deep doped structures possible, grid thickness no issue
  Damage free doping, even for high concentrations
  High doping concentration close to semiconductor-semimetal transition possible
Disadvantages:
  Sharp corners of epitaxial grids result in electric field crowding limiting the blocking voltage of the device.
  A CMP or planarization process may be needed In the art there are solutions already known to improve the injection efficiency either by implementing a highly-doped epitaxial layer or a high dose ion implantation as detailed below.

Simultaneous formation of Schottky and Ohmic contacts is disclosed in U.S. Pat. No. 6,936,850 relating to a semiconductor device made from silicon carbide with a Schottky contact and an Ohmic contact made from a Nickel-Aluminum material, however the injection from the P+ implanted region is not efficient. The surface Schottky contact is sensitive to the high electric field.

Using heterojunction barrier regions is detailed in US 2011/021533 relating to semiconductor devices with heterojunction barrier regions and methods of fabrication the same. The injection from the P+ implanted region is not efficient. A surface Schottky is made which is sensitive to the high electric field which can increase the leakage current.

Implementing non-implanted barrier regions is disclosed in U.S. Pat. No. 9,466,674 relating to semiconductor devices with non-implanted barrier regions and methods of fabricating it. Also in this case a surface Schottky is made which is sensitive to the high electric field which can increase the leakage current.

Implementing a double layer P+/P grid with P/P+ is detailed in US 2006/0255423 disclosing silicon carbide junction barrier Schottky diodes with suppressed minority carrier injection. The injection from the P+ implanted region is not efficient. Also, a surface Schottky is made which is sensitive to high electric field which can increase the leakage current.

Using P+ implantation inside trenches together with an epitaxial P+ region is detailed in US 2014/0138705, disclosing super surge diodes. The Schottky contact is made on a trenched surface which can result in an electric field-sensitive Schottky contact and can also cause barrier inhomogeneity, which both increases the leakage current.

Using extra P+ implanted regions inside the P regions to improve the injection is disclosed in U.S. Pat. No. 9,577,046. The injection from the P+ implanted region is not efficient. The surface Schottky contact is sensitive to the high electric field.

To transform sharp corners of etched epitaxial P+ regions by growth of an epitaxial layer in a trench etched structure with rounding is disclosed in U.S. Pat. No. 6,897,133. This is a complicated process that requires advanced etching and planarization techniques.

The sharp corner issue is also known from trench grid fabrication by combining trench etching and ion-implantation, where rounded corners had to be etched, see U.S. Pat. No. 8,633,560.

Epitaxial termination is disclosed in U.S. Pat. No. 6,673,662. There is a high electric field in sharp corners of the etched epitaxial layer.

SUMMARY

It is an object of the present invention to obviate at least some of the disadvantages in the prior art and provide an improved feeder structure to SiC power devices.

The invention is to integrate an epitaxial PiN diode with the feeder of a buried grid (BG) SiC power device like a Schottky diode or a MOSFET and using the BG to protect the sharp corners of the PiN from high electric field at voltage blocking. This combines the low forward voltage drop of Schottky diodes or MOSFETs at rated current with switch to efficient PiN diode during surge current or short circuit conditions.

The proposed structure combines the advantage of epitaxial P+ region with high injection efficiency and the P+ buried grid shielding electric field sensitive device areas, in order to reduce the reverse leakage current as well as to protect the sharp corners of the epitaxial P+ region.

In a first aspect there is provided a structure in a SiC semiconductor material comprising an n-type substrate (1), an n-type drift layer (2), at least two p-type grids (4, 5) and region (6) in an n-type SiC material (3), wherein the structure comprises an n-type epitaxially grown layer of SiC (8), wherein the epitaxially grown n-type layer (8) is in contact with the at least two p-type grids (4, 5) and the n-type SiC material (3), wherein the n-type epitaxially grown layer (8) is in contact with at least one epitaxially grown p-type region (7), wherein an Ohmic contact (9) is in contact with the at least one epitaxially grown p-type region (7) and insulators (10) and conductive layer (11) are provided, wherein a projection of the at least one epitaxially grown p-type region (7) in a plane parallel with the n-type substrate (1) has a boundary line (I) limiting the projection of the at least one epitaxially grown p-type region (7), wherein the p-type grid(s) (5) is applied at least so that a projection of the p-type grid(s) (5) in a plane parallel to the n-type substrate (1) is in a surrounding of the boundary line (I), so that the distance from the boundary line (I) to any point in the surrounding is maximum 0.5 µm, and wherein the p-type grid(s) (5) also is applied only so that the distance from the lower part of the at least one epitaxially grown p-type region (7) to the upper part of the p-type grid(s) (5) is in the range 0-5 µm, the direction up is given by the direction perpendicular away from the n-type substrate (1).

Further aspects and embodiments are defined in the appended claims, which are specifically incorporated herein by reference.

Advantages include a high surge current capability due to low forward voltage drop of the epitaxial PiN diode due to improved injection efficiency due to the highly-doped epitaxial P++ region (7).

A further advantage is the elimination of bipolar degradation caused by high dose ion implantation in the feeder region.

Yet another advantage is control and elimination of the snapback effect in conduction or on-state by changing the ratio of PiN diode area to Schottky diode or MOSFET area.

Further the invention gives design flexibility for different voltage classes by changing the dimensions and doping profile of the epitaxial PiN diode region.

BRIEF DESCRIPTION OF THE DRAWINGS

The invention is described with reference to the following drawings in which.

DETAILED DESCRIPTION

Figure 1A:
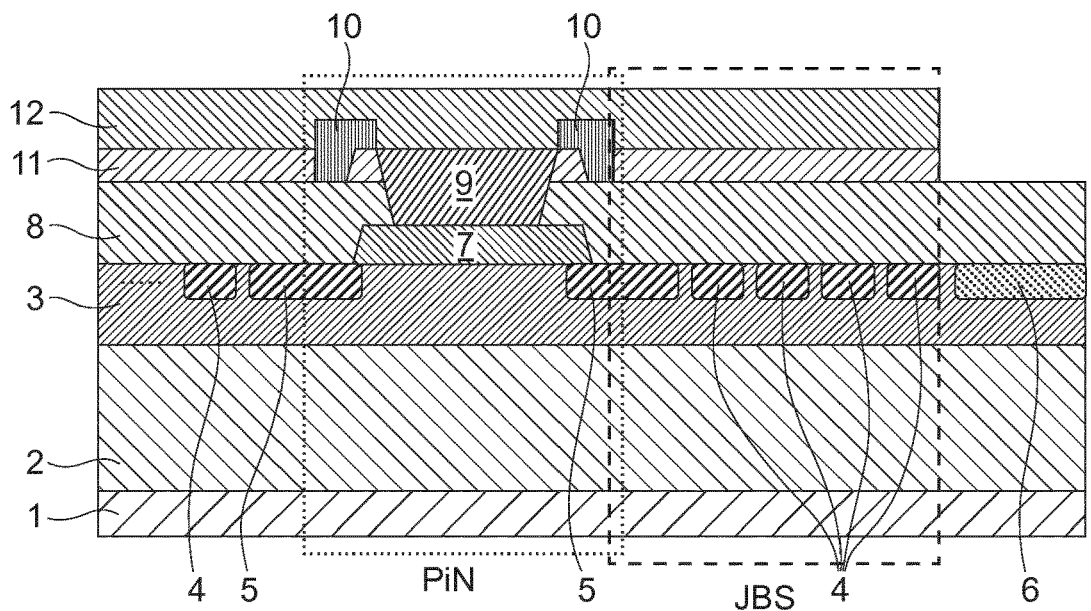
FIG. 1A shows a schematic cross-sectional view of a buried grid rectifier.

FIG. 1A shows a schematic cross-sectional view of a buried grid rectifier with combination of an epitaxial PiN feeder and an implanted grid for shielding with a P+ epilayer region (7) centrally aligned on top of the P+ implanted grids (5).

Figure 1B:
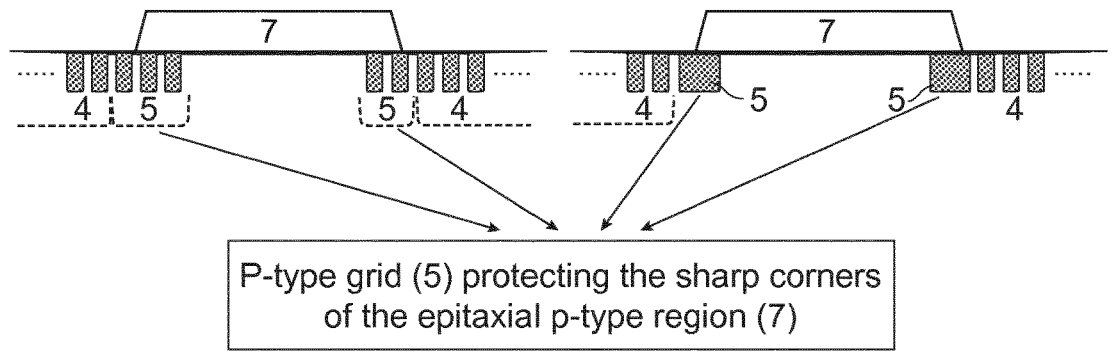
FIG. 1B shows a schematic cross-sectional view of a P+ epilayer region shielded by extra overlapping P+ grids, or alternatively overlapping and prolonged P+ grids.

FIG. 1B shows a schematic cross-sectional view of a P+ epilayer region (7) shielded by extra overlapping P+ grids (4, 5), or alternatively overlapping and prolonged P+ grids (5).

Figure 1C:
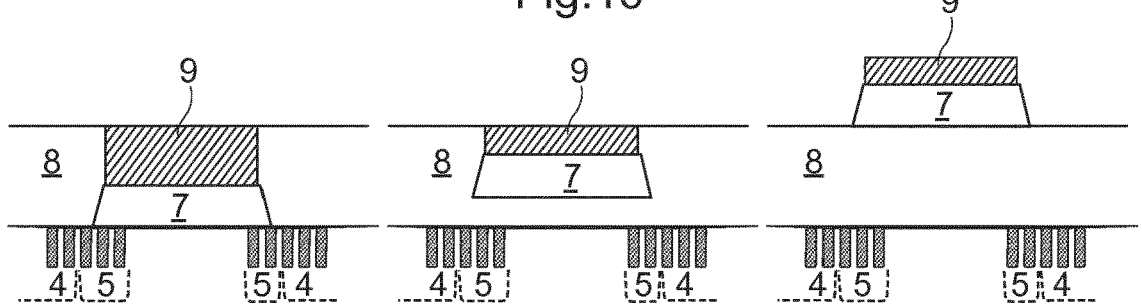
FIG. 1C shows a schematic cross-sectional view of different positioning of the P+ epilayer with spacing from the top of the P+ grids.

FIG. 1C shows a schematic cross-sectional view of different positioning of the P+ epilayer (7) with spacing from the top of the P+ grids (4, 5).

Figure 1D:
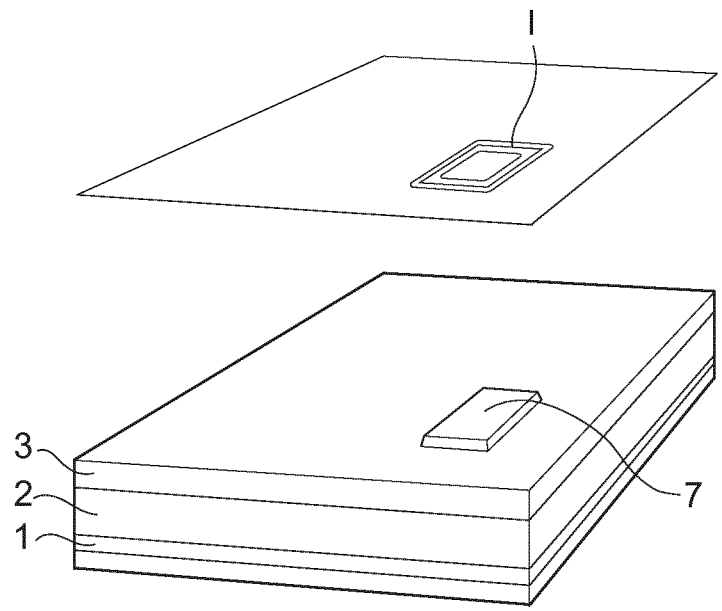
FIG. 1D shows parts of a device according to the invention, some parts are not shown for clarity.
Figure 2A:
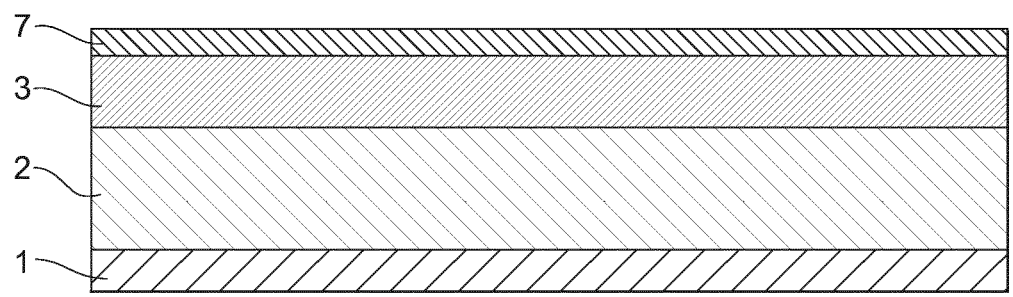
FIGS. 2A-2G show proposed fabrication process steps for the proposed structure in FIG. 1A as a non-limiting example shown in order to facilitate use of the invention.
Figure 2B:
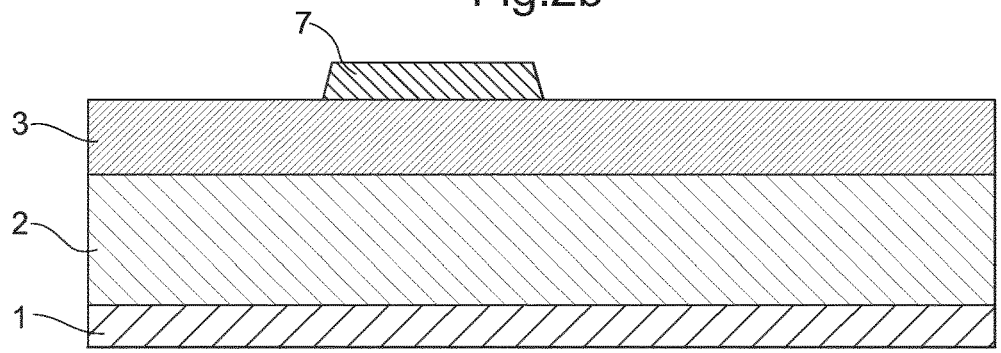
Figure 2C:
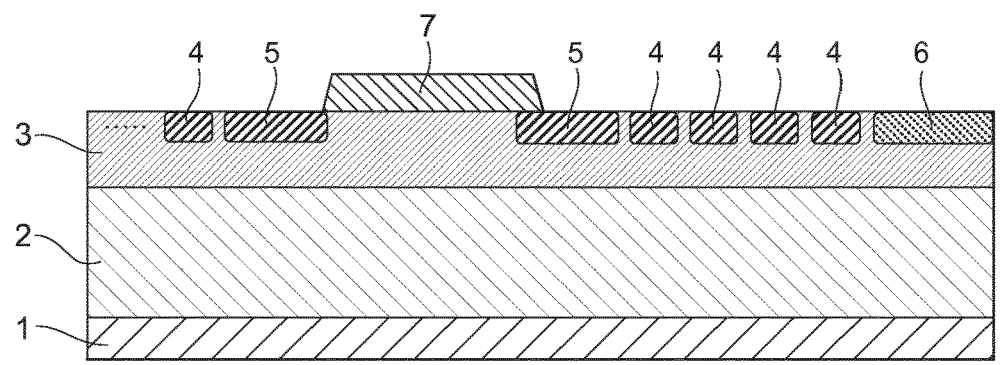
Figure 2D:
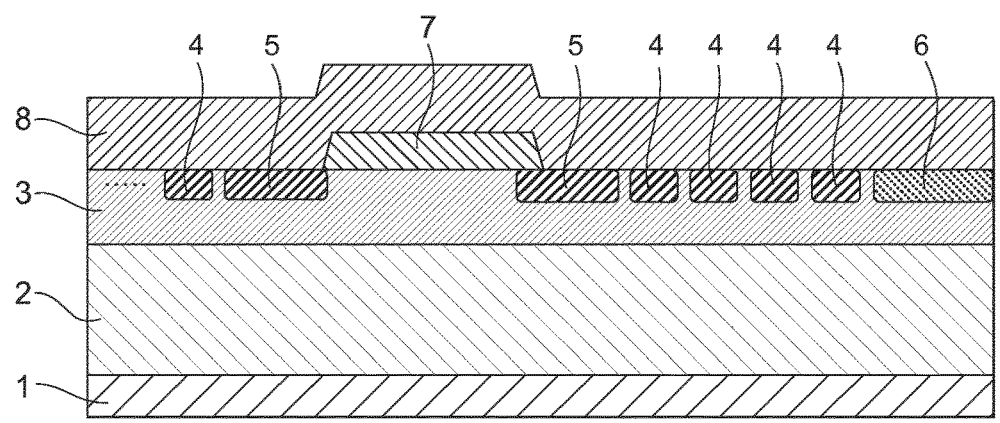
Figure 2E:
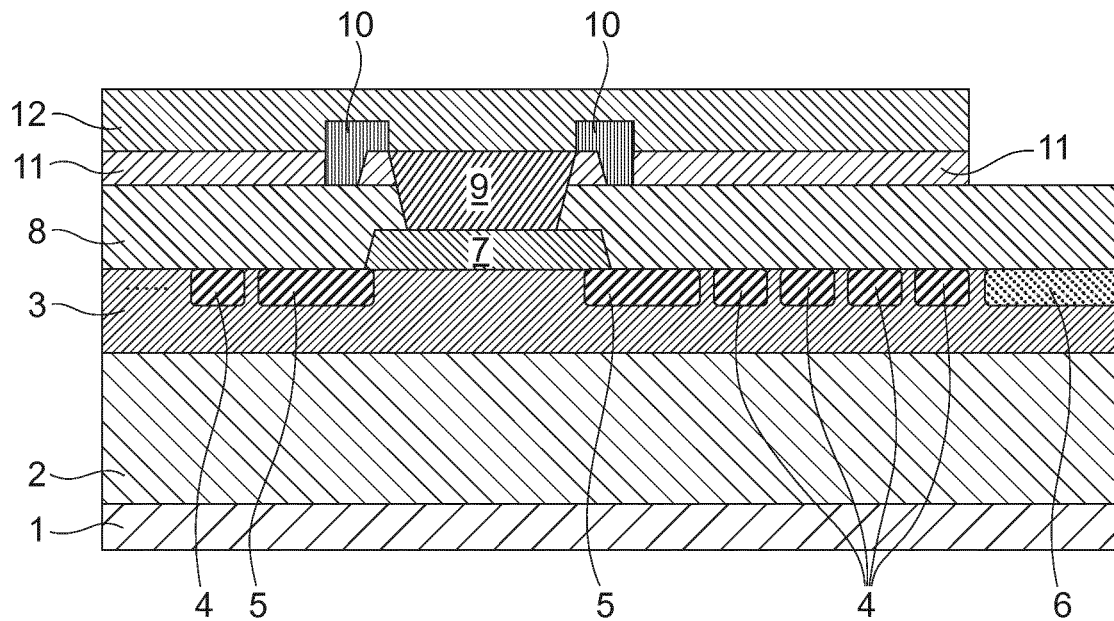
Figure 2F:
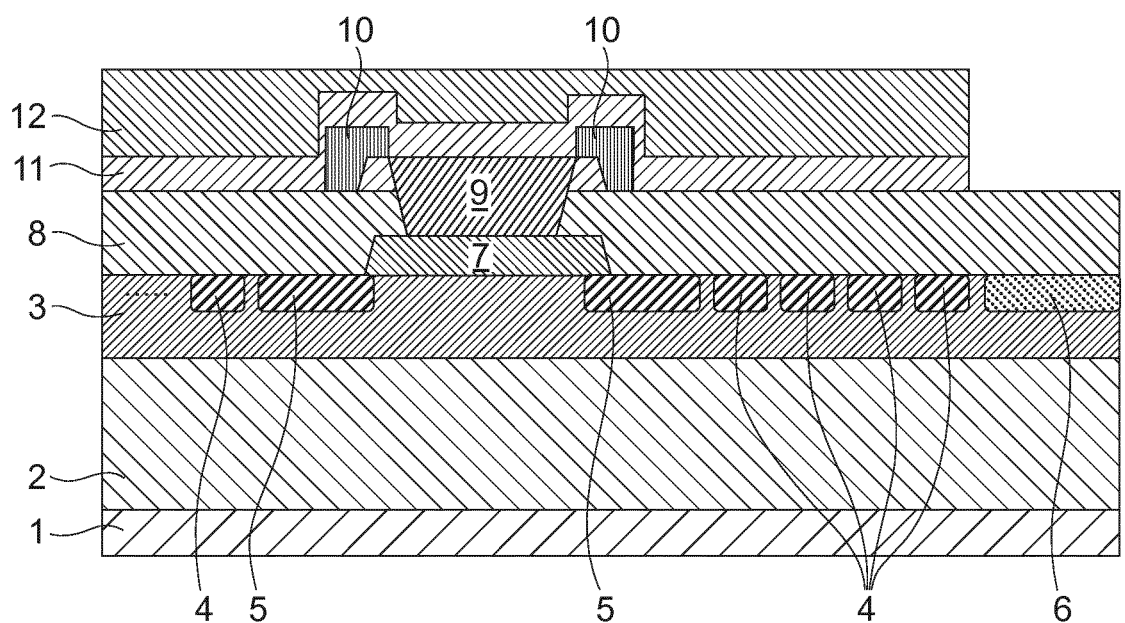
Figure 2G:
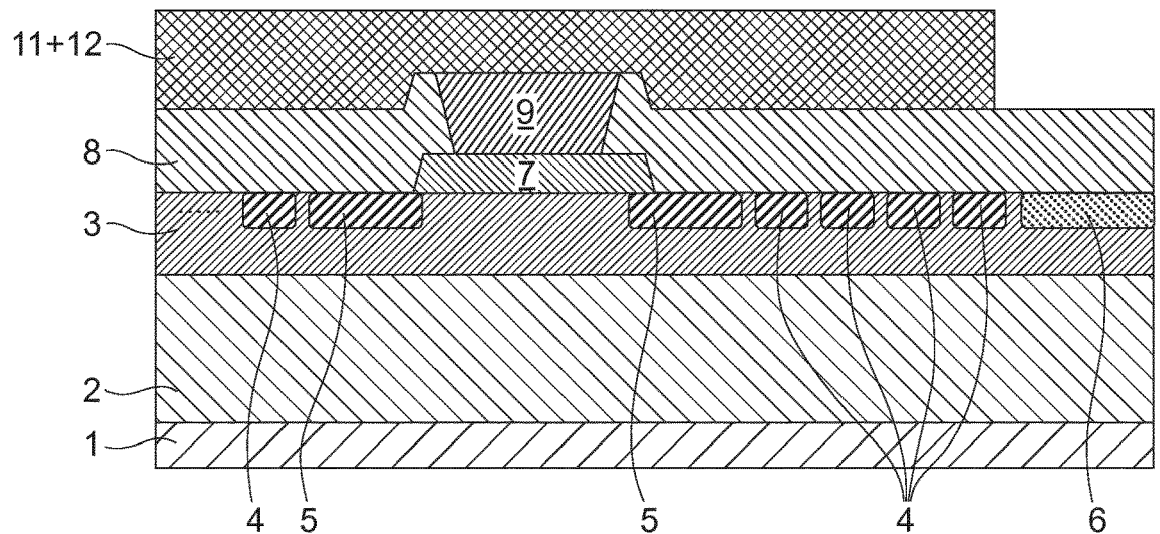
Figure 3A:
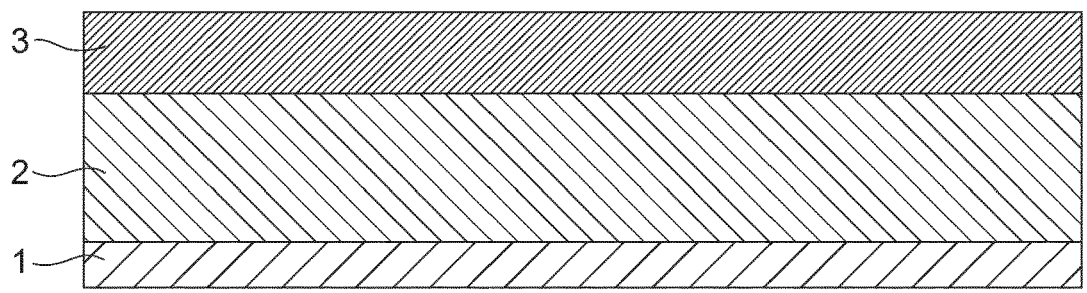
FIGS. 3A-3F show proposed fabrication process steps for the proposed structure in FIG. 1A as a non-limiting example shown in order to facilitate use of the invention.
Figure 3B:
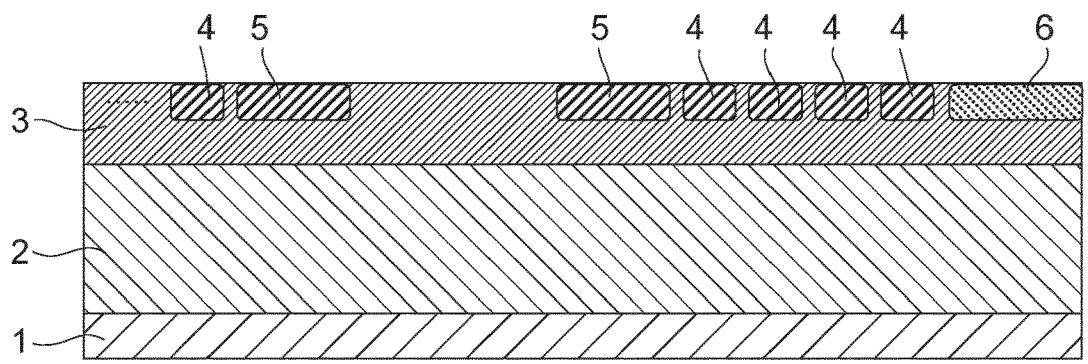
Figure 3C:
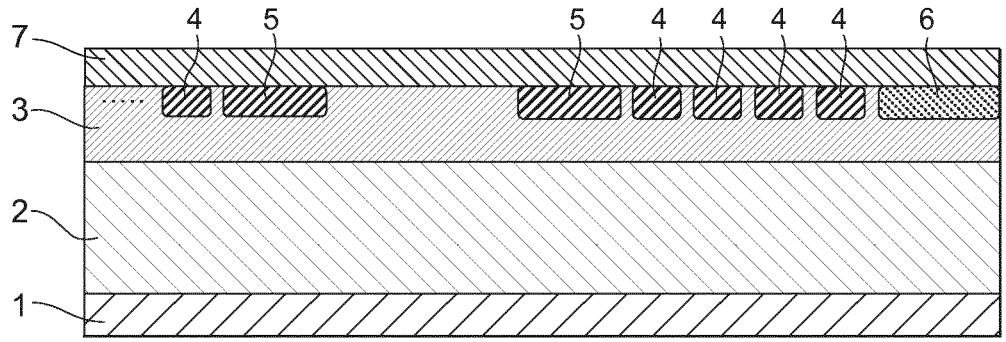
Figure 3D:
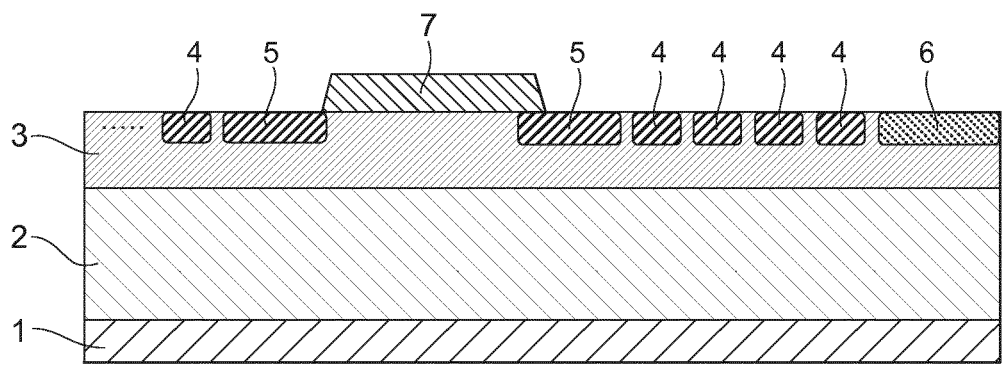
Figure 3E:
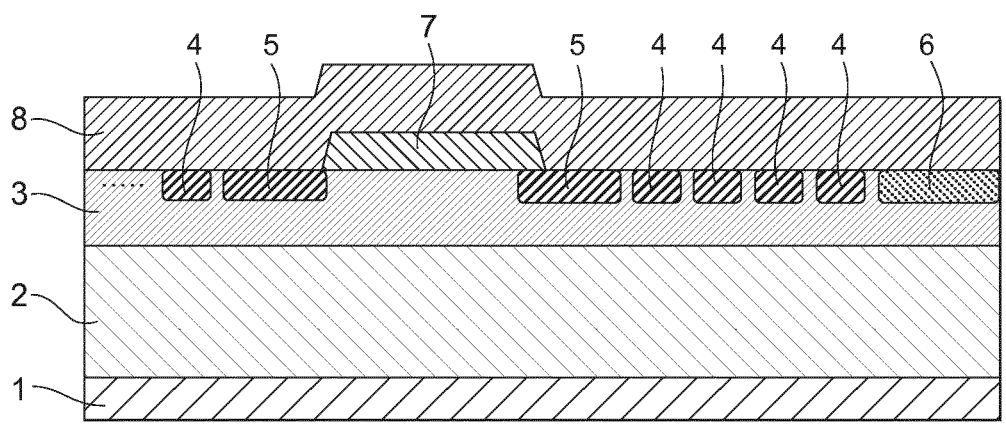
Figure 3F:
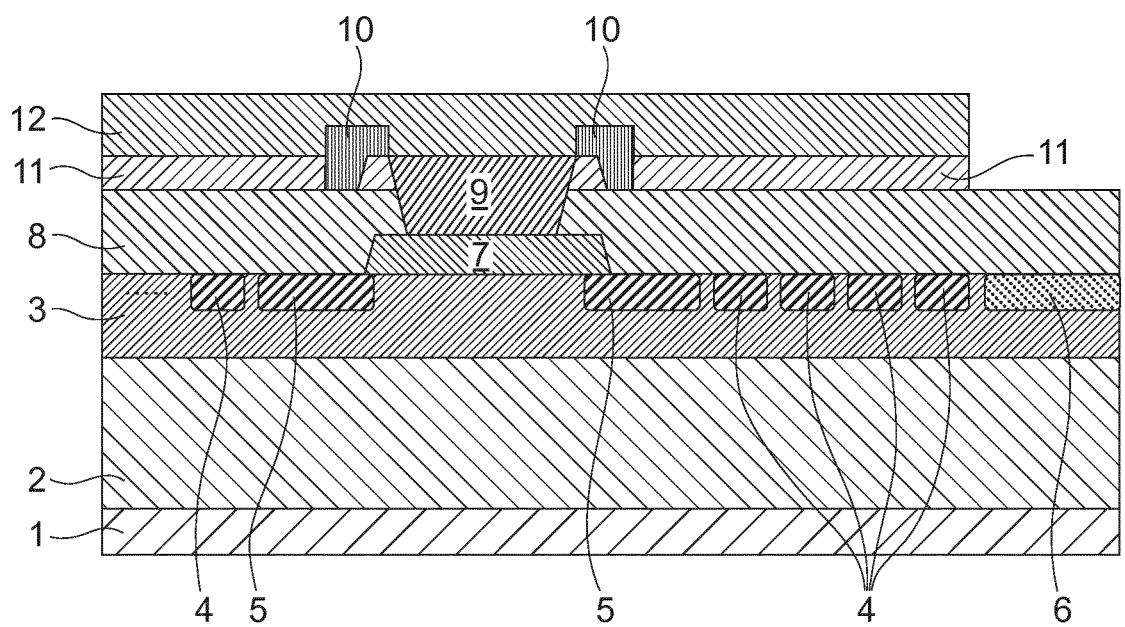
Figure 4A:
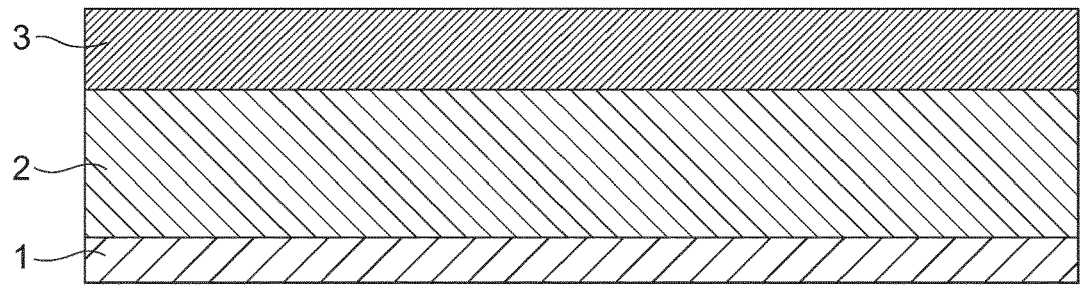
FIGS. 4A-4G show proposed fabrication process steps for the proposed structure in FIG. 1A as a non-limiting example shown in order to facilitate use of the invention.
Figure 4B:
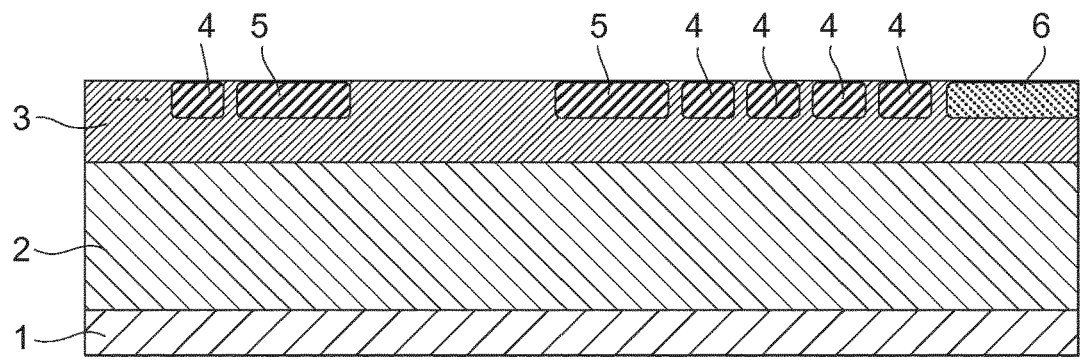
Figure 4C:
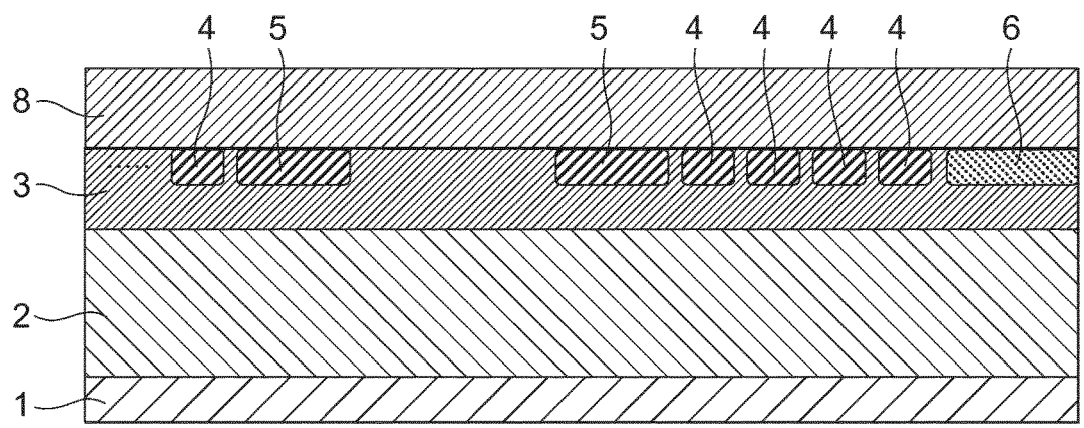
Figure 4D:
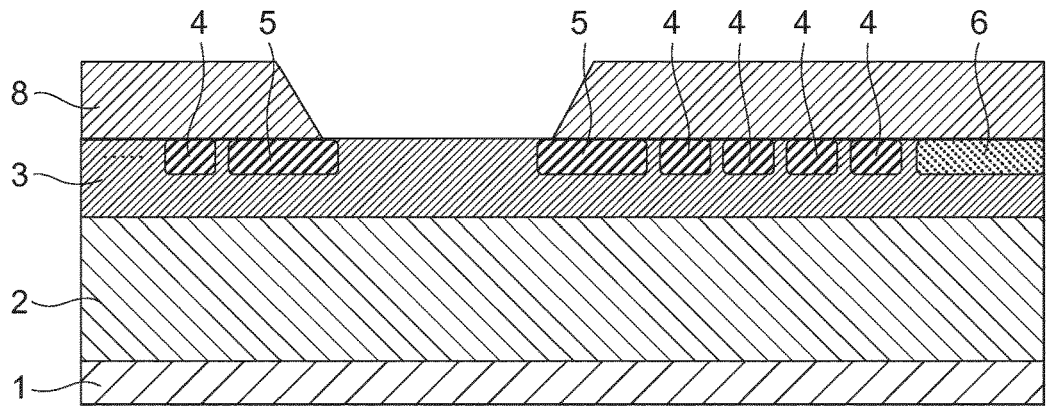
Figure 4E:
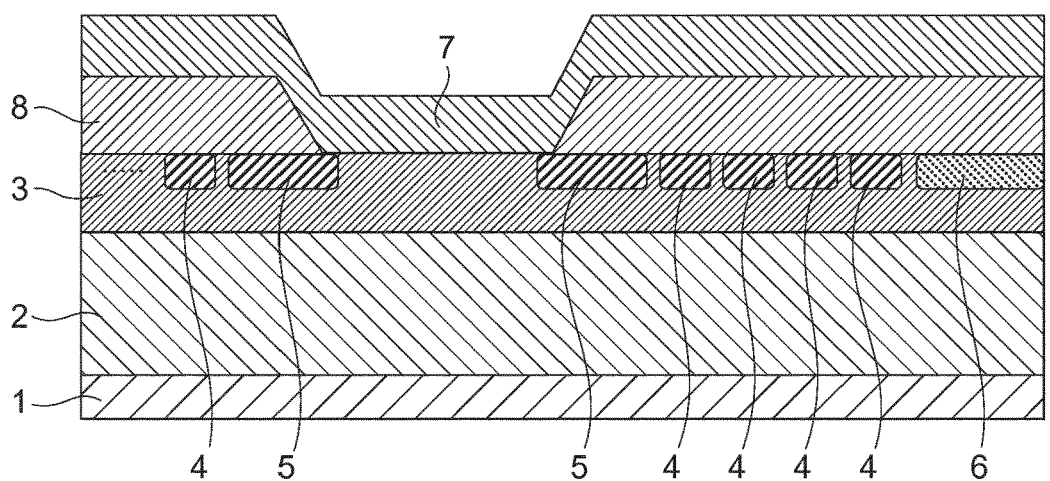
Figure 4F:
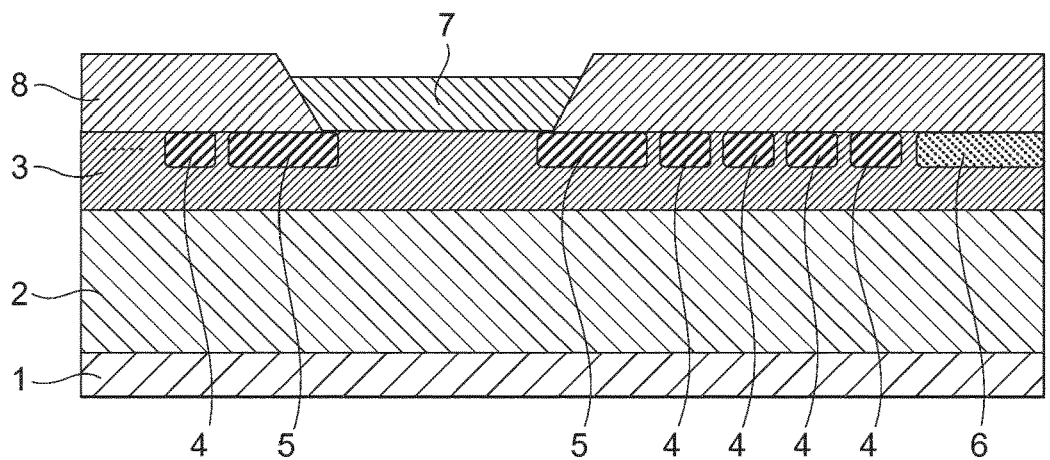
Figure 4G:
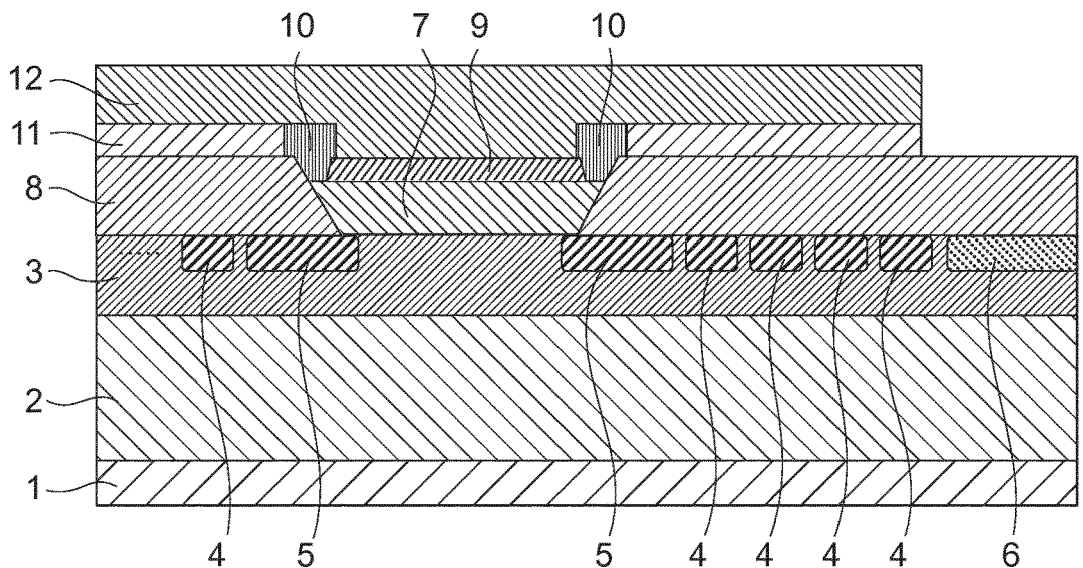
Figure 5A:
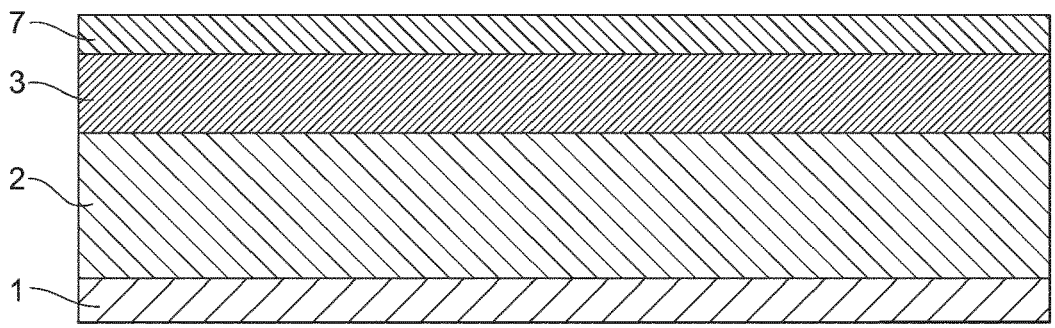
FIGS. 5A-5E show proposed fabrication process steps for the proposed structure in FIG. 1B as a non-limiting example shown in order to facilitate use of the invention.
Figure 5B:
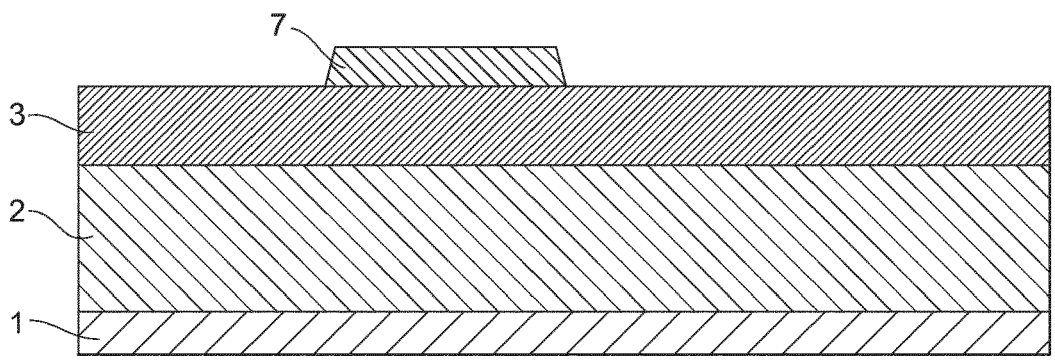
Figure 5C:
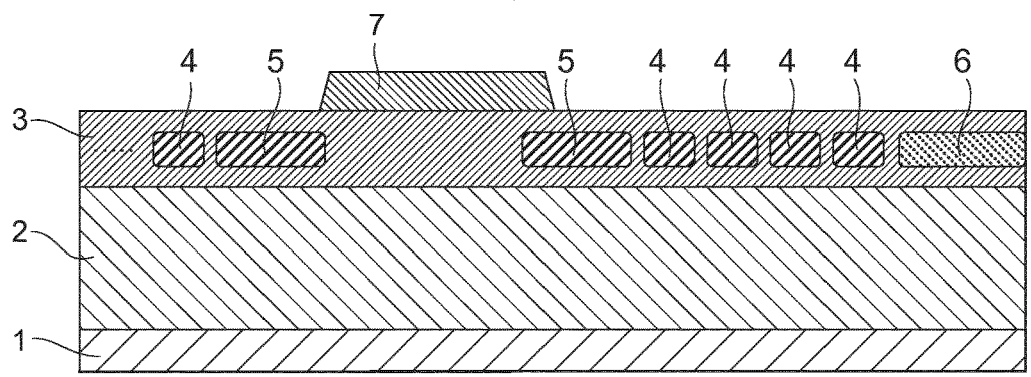
Figure 5D:
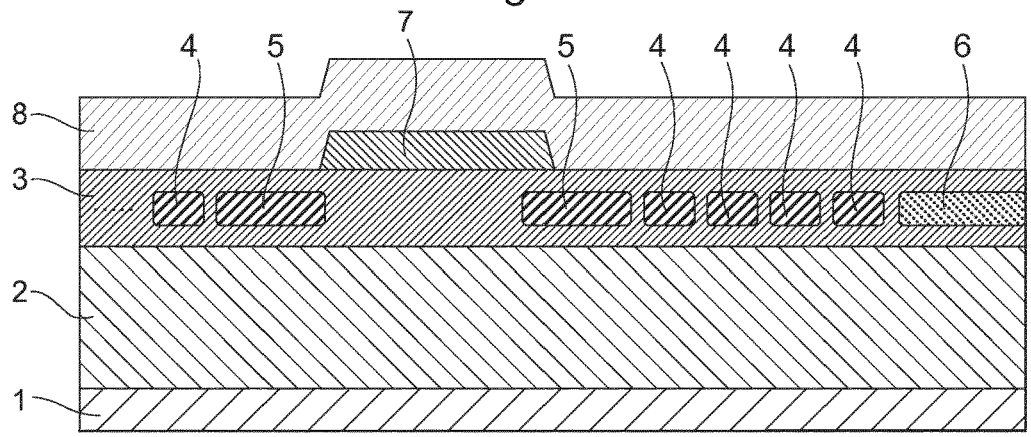
Figure 5E:
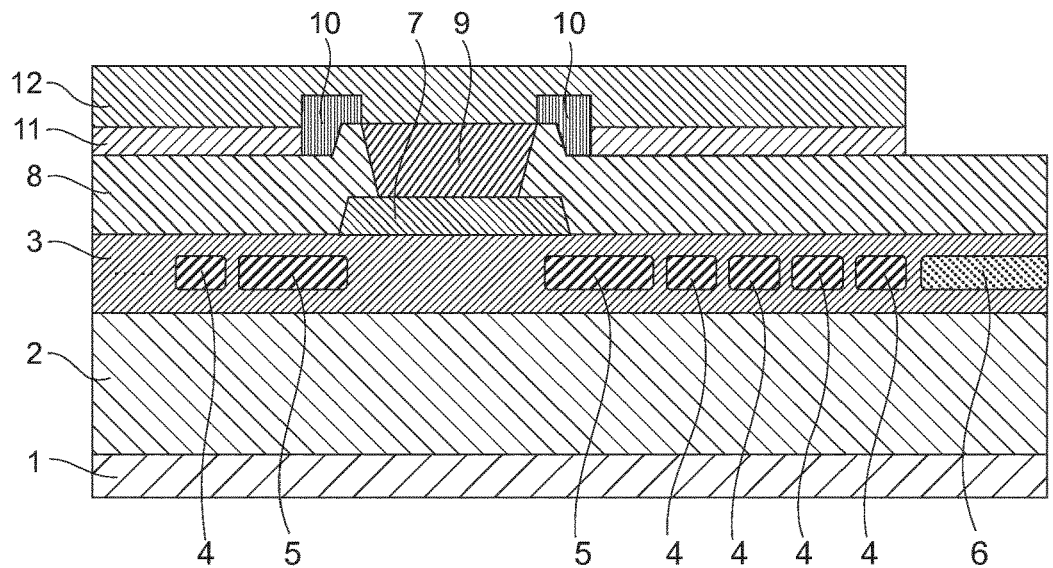
Figure 6A:
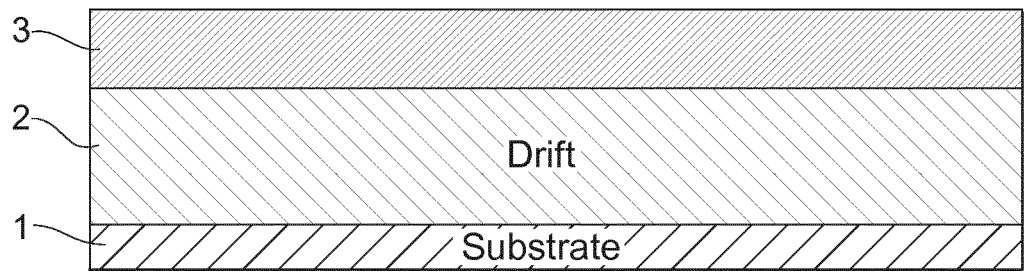
FIGS. 6A-6E show six different proposed fabrication process steps for the proposed structure in FIG. 1B as a non-limiting example shown in order to facilitate use of the invention.
Figure 6B:
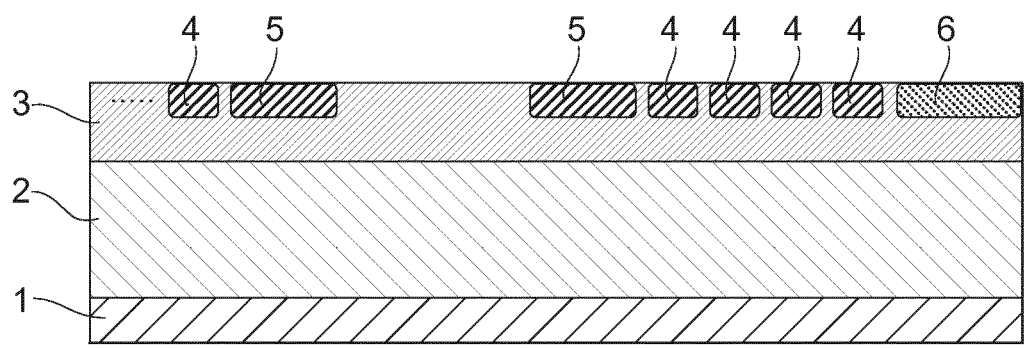
Figure 6C:
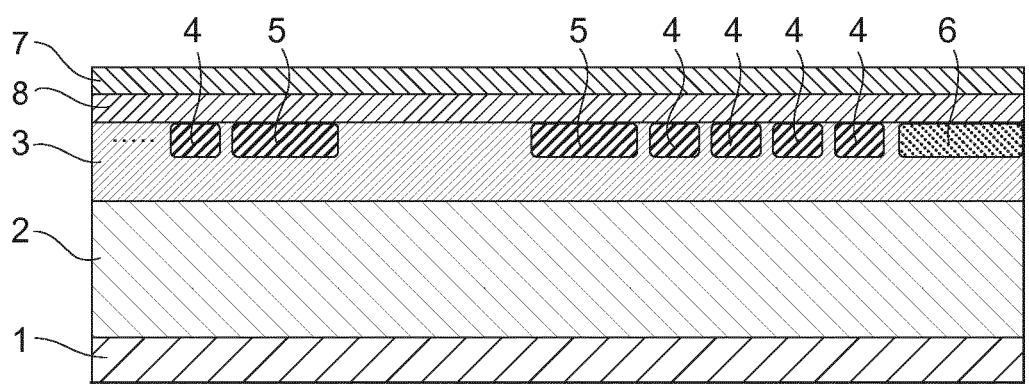
Figure 6D:
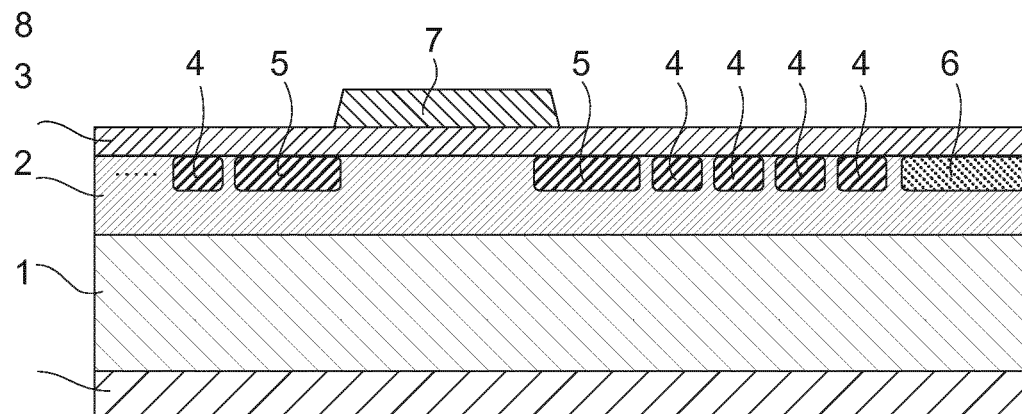
Figure 6E:
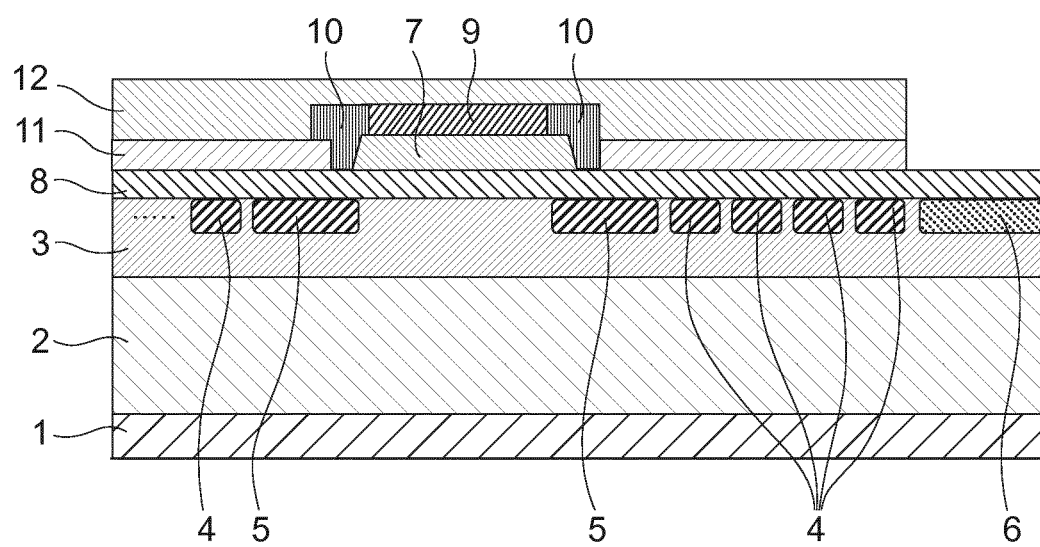
Figure 7A:
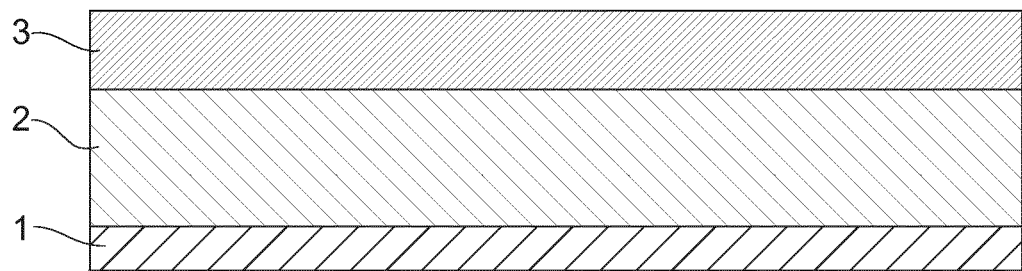
FIGS. 7A-7G show proposed fabrication process steps for the proposed structure in FIG. 1B as a non-limiting example shown in order to facilitate use of the invention.
Figure 7B:
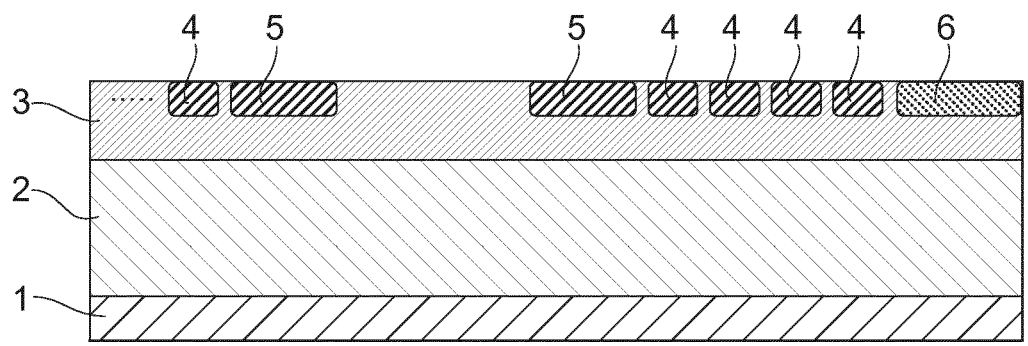
Figure 7C:
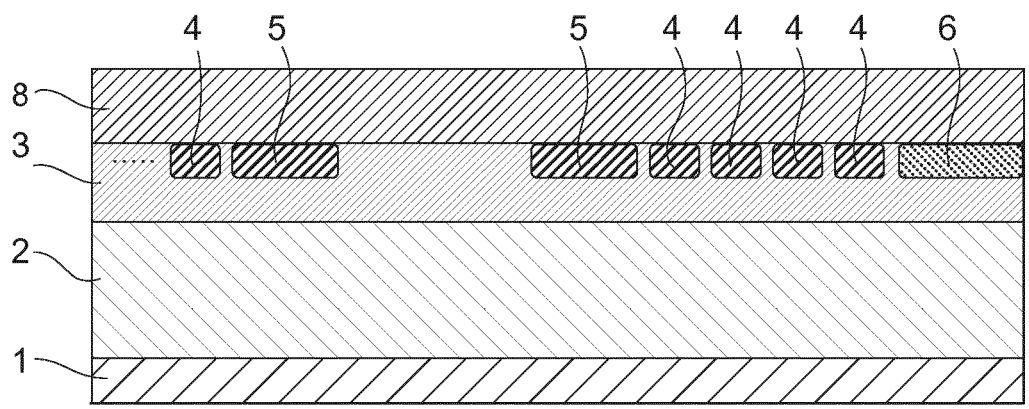
Figure 7D:
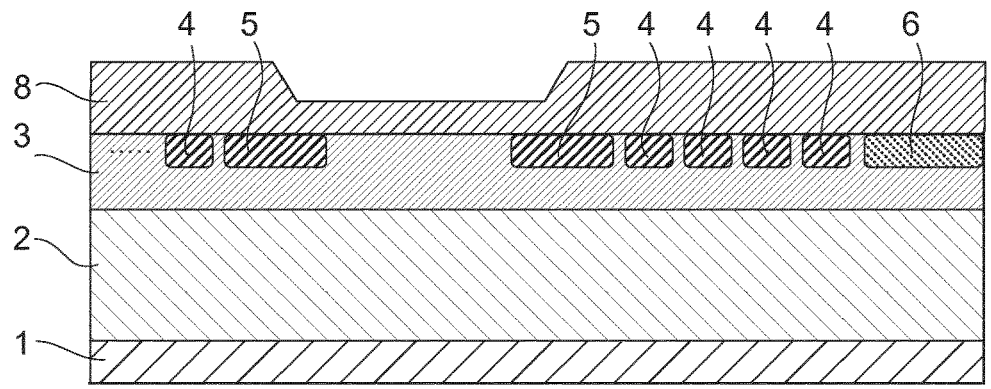
Figure 7E:
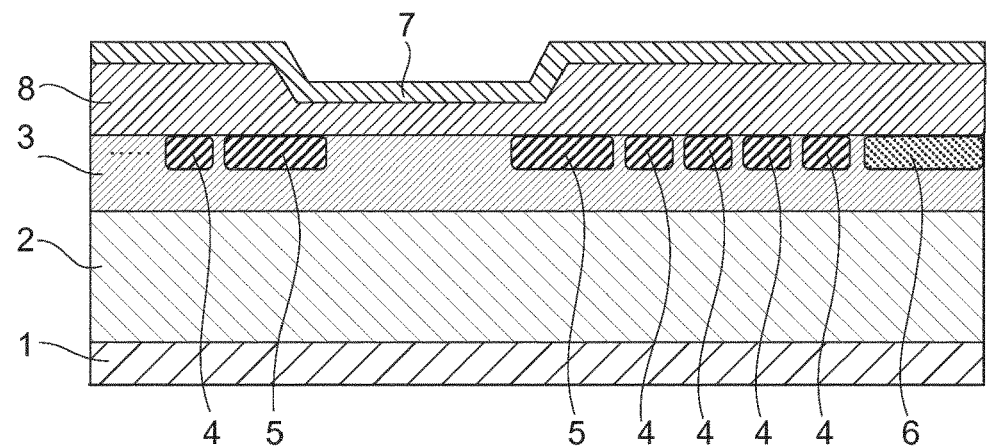
Figure 7F:
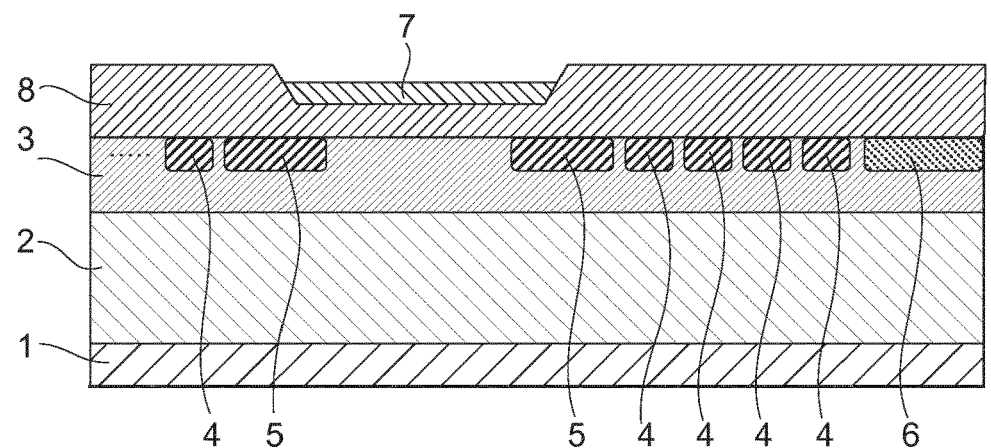
Figure 7G:
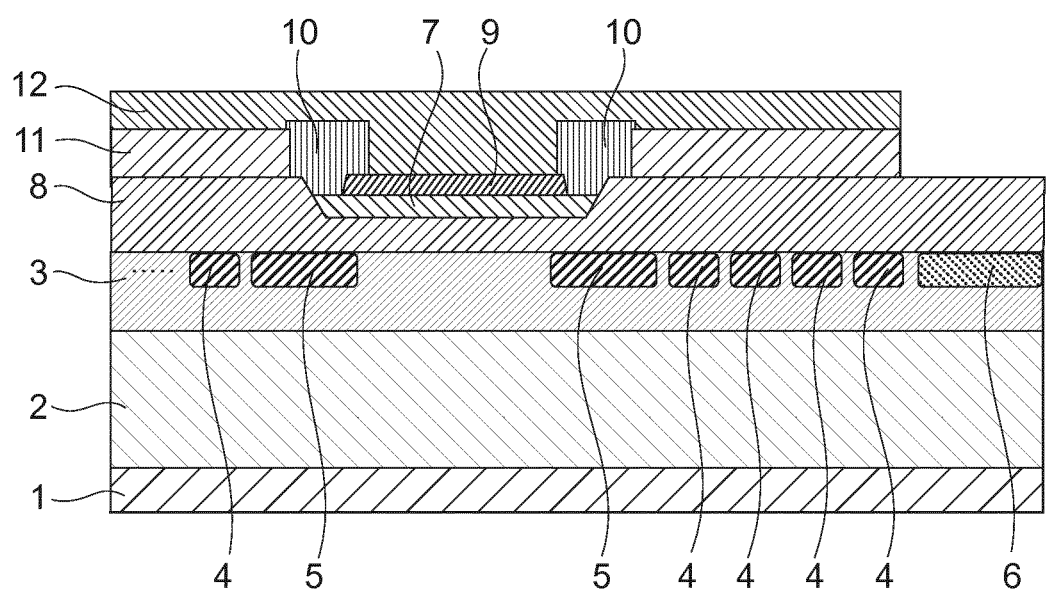

FIG. 1D shows parts of a device according to the invention, some parts are not shown for clarity. There is shown a substrate (1), a drift layer (2), an n-type SiC material (3), and an epitaxially grown p-type region (7) as well as a plane parallel with the substrate (1) and the projection of the epitaxially grown p-type region (7) in the plane including the boundary line (I) of the projection in the plane. The surrounding of the boundary line (I) in the plane are indicated with solid lines, so that the distance from the boundary line (I) to any point in the surrounding is maximum 0.5 µm. Any corners of the surrounding area are rounded so that the surrounding around the line is determined by a circle with radius 0.5 µm which is moved along the boundary line (I).

FIGS. 2A-2G, 3A-3F, and 4A-4G, show different proposed fabrication process steps for the proposed structure in FIG. 1A (FIGS. 2-4), and FIGS. 5A-5E, 6A-6E, and 7A-7G show different proposed fabrication process steps for the proposed structure in FIG. 1B. These are non-limiting examples shown in order to facilitate use of the invention.

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

"Buried grid" as used throughout the description and the claims denotes a grid structure of a material with one conductivity type in a material with the opposite conductivity type.

"Conductivity type" as used throughout the description and the claims denotes the type of conduction in a semiconductor material. N-type denotes electron conduction meaning that excess electrons move in the semiconductor giving a current flow and p-type denotes hole conduction, meaning that excess holes move in the semiconductor driving a current flow. An n-type semiconductor material is achieved by donor doping and a p-type semiconductor by acceptor dopants. In SiC, nitrogen is commonly used as donor dopant and aluminum as acceptor dopant. If a material is a doped semiconductor such as SiC, the material either has conductivity type p or conductivity type n. A skilled person realizes that in a semiconductor device all n-doped materials can be exchanged to p-doped materials when all p-doped materials are exchanged to n-doped materials, i.e. n and p can change place, and still a similar device can be obtained.

"Doped" as used throughout the description and the claims denotes that an intrinsic semiconductor such as SiC has got added impurities to modulate its electrical properties and become an extrinsic semiconductor.

"Epitaxial" as used throughout the description and the claims denotes that the material has been manufactured with epitaxial growth, in this case epitaxial growth of SiC.

"Substrate" as used throughout the description and the claims denotes a piece of material on which the power device is built up.

If nothing else is defined, any terms and scientific terminology used herein are intended to have the meanings commonly understood by those of skill in the art to which this invention pertains.

In a first aspect there is provided a structure in a SiC semiconductor material comprising a n-type substrate (1), a n-type drift layer (2), at least two p-type grids (4, 5) in an n-type SiC material (3), wherein the structure comprises an n-type epitaxially grown layer of SiC (8), wherein the epitaxially grown n-type layer (8) is in contact with the at least two p-type grids (4, 5) and the n-type SiC material (3), wherein the n-type epitaxially grown layer (8) is in contact with at least one epitaxially grown p-type region (7), wherein an Ohmic contact (9) is in contact with the at least one epitaxially grown p-type region (7), wherein a projection of the at least one epitaxially grown p-type region (7) in a plane parallel with the n-type substrate (1) has a boundary line (I) limiting the projection of the at least one epitaxially grown p-type region (7), wherein the p-type grid(s) (5) is applied at least so that a projection of the p-type grid(s) (5) in a plane parallel to the n-type substrate (1) is in a surrounding of the boundary line (I), so that the distance from the boundary line (I) to any point in the surrounding is maximum 0.5 µm, and wherein the p-type grid(s) (5) also is applied only so that the distance from the lower part of the at least one epitaxially grown p-type region (7) to the upper part of the p-type grid(s) (5) is in the range 0-5 µm, the direction up is given by the direction perpendicular away from the n-type substrate (1).

The surrounding of the boundary line (I) can be determined so that a circle with radius 0.5 µm is moved along the boundary line (I) and the area swept over by the circle is within the surrounding so that the distance from the boundary line (I) to any point in the surrounding is maximum 0.5 µm. This is applicable to any shape of the boundary line (I). If the epitaxially grown p-type region (7) has the form of a very long trench there may be two boundary lines. If viewed from above, i.e. from a position looking at the largest area of the substrate (1), then the p-type grid (5) is applied close to the boundary of the epitaxially grown p-type region (7), more in particular within ±0.5 µm from the boundary line. This defines a surrounding of ±0.5 µm from the boundary line and the p-type feeder layer (5) is applied at least in this surrounding, it can also be applied outside this surrounding. The p-type grid (5) should also be applied fairly close to the epitaxially grown p-type region (7), seen from the side, i.e. looking at a cross cut of the device. Then the p-type grid (5) is either in contact with the epitaxially grown p-type region (7), or maximum 5 µm below the epitaxially grown p-type region (7). Since the projection of the epitaxially grown p-type region (7) is used to determine the boundary line (I), the largest part of the epitaxially grown p-type region (7) determines the position of the p-type grid (5). Since the cross section of the p-type grid (5) in the cross section seen in FIG. 1D is fairly close to rectangular, the condition will imply that the p-type grid (5) is applied at least close to the corners where they will mitigate the effects of the corners on the electrical field.

In one embodiment the at least one epitaxially grown p-type region (7) is in contact with the at least one of the at least two p-type grids (4, 5).

In one embodiment the at least one epitaxially grown p-type region (7) is not in contact with the at least two p-type grids (4, 5).

In one embodiment the at least two p-type grids (4, 5) each comprises a plurality of ion implanted grids.

In one embodiment the width of the at least one epitaxially grown p-type region (7) is in the interval 5-500 µm.

In one embodiment the thickness of the at least one epitaxially grown p-type region (7) is in the interval 1-3 µm.

In one embodiment the doping concentration of the at least one epitaxially grown p-type region (7) varies from closest to the n-type SiC material (3) to closest to the Ohmic contact (9).

In one embodiment the doping concentration of the at least one epitaxially grown p-type region (7) is highest closest to the Ohmic contact (9).

In one embodiment the doping concentration of the at least one epitaxially grown p-type region (7) is in the interval 5e17 cm-3 to 1e19 cm-3 except in a layer closest to the Ohmic contact (9) where it is in the interval 1e19 cm-3 to 3e20 cm-3.

In one embodiment the center of the at least one epitaxially grown p-type region (7), calculated as the center of gravity, is aligned with the center of the region in the n-type SiC material (3) between the first and a second regions without any grids.

In one embodiment there is a space between the at least one epitaxially grown p-type region (7) and the at least two p-type grids (4, 5) in the n-type SiC material (3), optionally with a connection between the at least one epitaxially grown p-type region (7) and the at least two p-type grids (4, 5)

In one embodiment the at least one epitaxially grown p-type region (7) is applied directly on the at least two p-type grids (4, 5) in an n-type SiC material (3).

In one embodiment there are at least four p-type grids (4, 5) and wherein the at least two p-type grids (5) closest to the at least first and second corners respectively are larger than the remaining p-type grids (4).

In one embodiment the doping concentration of the at least two p-type grids (4, 5) is in the interval 3e17 cm-3 to 3e20 cm-3, wherein the thickness of the at least two p-type grids (4, 5) is in the interval 0.5 to 2.5 µm, wherein the width of each of the at least two p-type grids (4, 5) is at least 0.5 µm.

In one embodiment there are at least three two p-type grids (4, 5), and wherein the space between two adjacent p-type grids (4, 5) is in the interval 1 to 5 µm, not taking into account the region in the n-type SiC material (3) between the first and a second regions without any grids as a space.

In one embodiment the thickness of the epitaxially grown n-type layer (8) is at least 0.5 µm and the doping concentration is in the interval 1e14 cm-3 and 1e17 cm-3.

In one embodiment the thickness of the epitaxially grown n-type layer (8) is at least 0.5 µm thicker than the at least one epitaxially grown p-type region (7).

In one embodiment the at least two p-type grids (4, 5) comprise a plurality of grids, wherein at least a part of the grids has a ledge positioned centered under the grid, said ledge positioned in a direction away from the epitaxially grown n-type layer (8), said ledge having a smaller lateral dimension than the grid. This feature increases the electric filed shielding efficiency of the grid which is reducing the electric field on the surface of the device. This increases the blocking voltage and lower the leakage current without adding forward resistance. Alternatively a wider grid spacing can be used with this design, leading to lower on-resistance. The structure is more tolerant to process variations such as misalignment, dose and energy variation in ion implantation, etching depth etc.

In one embodiment the at least two p-type grids (4, 5) comprise a plurality of grids and wherein each grid comprises an upper part and a lower part said upper part is towards the epitaxially grown n-type layer (8), and wherein the upper part is manufactured using epitaxial growth and wherein the lower part is manufactured using ion implantation. In this embodiment it is possible to manufacture a grid with rounded corners as well as an upper part with a high doping level. It is possible to manufacture a component with efficient voltage blocking, high current conduction, low total resistance, high surge current capability, and fast switching.

In one embodiment the at least two p-type grids (4, 5) are manufactured by ion implantation.

In a second aspect there is provided a device comprising a structure as described above. In one embodiment the device is selected from the group consisting of a MOSFET, a JFET, a JBS diode, and an insulated-gate bipolar transistor (IGBT). In one embodiment the device is an integration of at least two components such as at least two of the mentioned components. One non-limiting example of an integration of at least two components is a MOSFET and a Schottky diode.

In a third aspect there is provided a method for the manufacture of a structure in SiC as described above and comprising the steps of:
a) providing a substrate with a drift layer and an n-type SiC material (3) on top,
b) adding a p-type layer by epitaxial growth of SiC,
c) etching away unwanted parts of the added p-type layer to obtain at least one epitaxially grown p-type region (7),
d) creating at least two p-type grids (4, 5) by ion implantation in the n-type SiC material (3),
e) adding an n-type layer (8) by epitaxial growth of SiC.

In one embodiment step d) is carried out before step b).

In one embodiment the steps are carried out in the order: a), b), c), d), e).

In one embodiment the steps are carried out in the order: a), d), e), b), c) with an additional step of etching a trench in the n-type layer (8) after step e), in a region intended for the at least one epitaxially grown p-type region (7).

In one embodiment the method comprises the step of adding an Ohmic contact (9) at least partially on the at least one epitaxially grown p-type region (7).

In one embodiment the method comprises the step of adding a metal coating (12).

The skilled person realizes that even if the claims and the description define p-type grids (4, 5) in an n-type SiC material (3), an n-type epitaxially grown layer and so on, all n-type and p-type materials can be interchanged so that all n-doped (n-type) materials are p-doped (p-type) materials and so that all p-doped (p-type) materials are n-doped (n-type) materials. Today the most common commercially available substrates are n-type and thus a n-type substrate has been chosen in the claims and in the description, but the invention can with equally good result be used if all n-type and p-type materials are interchanged.

The invention claimed is:
1. A semiconductor device, comprising:
an n-type substrate;
an n-type drift layer disposed on the n-type substrate;
a first n-type SiC layer disposed on the n-type drift layer;
a p-type grid disposed in the first n-type SiC layer;
a p-type region disposed on the first n-type SiC layer; and
a second n-type SiC layer disposed in contact with the first n-type SiC layer and the p-type region; and
an ohmic contact disposed in contact with the p-type region.

2. The semiconductor device of claim 1, wherein the p-type region, the first n-type SiC layer, and the ohmic contact form a PiN diode.

3. The semiconductor device of claim 1, wherein opposing edges of the p-type region overlap with at least a portion of the p-type grid.

4. The semiconductor device of claim 1, wherein a top surface of the p-type grid is coplanar with a top surface of the first n-type SiC layer, and
wherein one of:
the top surface of the p-type grid contacts a lower surface of the p-type region;
the top surface of the p-type grid is spaced apart from a lower surface of the p-type region by portions of the second n-type SiC layer; and
the top surface of the p-type grid is spaced apart from a lower surface of the p-type region by an entirety of the second n-type SiC layer.

5. The semiconductor device of claim 4, wherein the top surface of the p-type grid contacts opposing edges of the lower surface of the p-type region.

6. The semiconductor device of claim 1,
wherein a top surface of the p-type grid is spaced apart from a top surface of the first n-type SiC layer, and
wherein a bottom surface of the p-type grid is spaced apart from a bottom surface of the first n-type SiC layer.

7. The semiconductor device of claim 1, wherein at least a portion of the Ohmic contact is disposed in the second n-type SiC layer.

8. The semiconductor device of claim 1,
wherein a projection of the p-type region in a first plane parallel with a surface of the n-type substrate has a boundary line limiting the projection of the p-type region,
wherein the p-type grid is disposed so that a projection of the p-type grid in a second plane parallel with the surface of the n-type substrate is within a surrounding of the boundary line, and
wherein a distance from the boundary line to any point in the surrounding is a maximum of 0.5 μm.

9. The semiconductor device of claim 1, wherein a distance, along a direction perpendicular from a surface of the n-type substrate, from a lower part of the p-type region to an upper part of the p-type grid is in a range of 0 μm to 5 μm.

10. The semiconductor device of claim 1, wherein the p-type grid includes an upper part comprising epitaxial growth and a lower part comprising ion implantation.

11. The semiconductor device of claim 1, wherein the semiconductor device is one of a MOSFET, a JFET, a JBS diode, and an insulated-gate bipolar transistor (IGBT).

12. The semiconductor device of claim 1, wherein at least one of the p-type region and the ohmic contact comprises tapered sidewalls.

13. A PiN diode device comprising:
a drift layer disposed on a substrate;
a first SiC layer having a first conductivity type disposed on the drift layer;
a SiC region having a second conductivity type disposed on the first SiC layer;
a SiC grid having the second conductivity type disposed in the first SiC layer;
a second SiC layer having the first conductivity type disposed in contact with the first SiC layer and the SiC region; and
an Ohmic contact disposed in contact with the SiC region, wherein opposing edges of the SiC region overlap with portions of the SiC grid.

14. The device of claim 13, wherein a top surface of the SiC grid is coplanar with a top surface of the first SiC layer, and
wherein one of:
the top surface of the SiC grid contacts a lower surface of the SiC region;
the top surface of the SiC grid is spaced apart from a lower surface of the SiC region by portions of the second SiC layer; and
the top surface of the SiC grid is spaced apart from a lower surface of the SiC region by an entirety of the second SiC layer.

15. The device of claim 14, wherein the top surface of the SiC grid contacts opposing edges of the lower surface of the SiC region.

16. The device of claim 13,
wherein a top surface of the SiC grid is spaced apart from a top surface of the first SiC layer, and
wherein a bottom surface of the SiC grid is spaced apart from a bottom surface of the first SiC layer.

17. The device of claim 13, wherein at least a portion of the Ohmic contact is disposed in the second SiC layer.

18. The device of claim 13,
wherein a projection of the SiC region in a first plane parallel with a surface of the substrate has a boundary line limiting the projection of the SiC region,
wherein the SiC grid is disposed so that a projection of the SiC grid in a second plane parallel with the surface of the substrate is within a surrounding of the boundary line, and
wherein a distance from the boundary line to any point in the surrounding is a maximum of 0.5 μm.

19. The device of claim 18, wherein a distance, along a direction perpendicular from a surface of the, from a lower part of the SiC region to an upper part of the SiC grid is in a range of 0 μm to 5 μm.

20. The device of claim 13, wherein the SiC grid includes an upper part comprising epitaxial growth and a lower part comprising ion implantation.

21. A diode device comprising:
a first n-type SiC layer on a drift layer over a substrate;
a p-type SiC region on the first n-type SiC layer;
a second n-type SiC layer in contact with the first n-type SiC layer and the p-type SiC region; and
an Ohmic contact in contact with the p-type SiC region, wherein a p-type SiC grid is disposed in the first n-type SiC layer, and
wherein opposing edges of the p-type SiC region overlap with at least a portion of the p-type SiC grid.

* * * * *